(12) United States Patent
Matsubara et al.

(10) Patent No.: US 6,313,974 B1
(45) Date of Patent: Nov. 6, 2001

(54) RESISTOR FOR A SERVO AMPLIFIER AND SERVO AMPLIFIER PROVIDED THEREOF

(75) Inventors: Shunsuke Matsubara; Tatsuo Shinohara; Makoto Takeshita, all of Yamanashi (JP)

(73) Assignee: Fanuc Ltd., Yamanashi (JP)

( * ) Notice: Subject to any disclaimer, the term of this patent is extended or adjusted under 35 U.S.C. 154(b) by 0 days.

(21) Appl. No.: 09/295,109

(22) Filed: Apr. 21, 1999

(30) Foreign Application Priority Data

Apr. 21, 1998 (JP) .................................................. 10-125367

(51) Int. Cl.$^7$ ....................................................... H02H 9/00
(52) U.S. Cl. ................ 361/58; 361/25; 361/115
(58) Field of Search ............... 361/18, 58, 115, 361/92, 103, 106, 23, 24, 25

(56) References Cited

U.S. PATENT DOCUMENTS

| | | | |
|---|---|---|---|
| 3,813,937 | * | 6/1974 | Fletcher et al. ..................... 73/190 R |
| 4,739,232 | * | 4/1988 | Ishimoto ............................... 318/473 |
| 5,563,570 | | 10/1996 | Lee ......................................... 338/50 |

FOREIGN PATENT DOCUMENTS

| | | | |
|---|---|---|---|
| 0406448A1 | 1/1991 | (EP) | ................. G01K/1/16 |
| 02-121312 | 10/1990 | (JP) | ................. B60H/1/00 |
| 62-101201 | 6/1987 | (JP) | ................. H01C/1/01 |
| 051-29146 | 5/1993 | (JP) | ................. H01F/37/00 |

* cited by examiner

*Primary Examiner*—Stephen W. Jackson
(74) *Attorney, Agent, or Firm*—Staas & Halsey LLP

(57) ABSTRACT

Leg portions are provided at the four corners of a resistor that generates a large amount of heat and a partition panel is secured to the top of the leg portions through a heat-insulating spacer. A adiabatic layer is formed by an empty space between the resistor and the partition panel. Further, the transmission of heat from the resistor through the leg portions to the partition panel is suppressed by the heat-insulating spacer. A servo amplifier is connected to the mounting portions provided on the partition panel, at the side opposite the resistor main body. As the transmission of heat generated by the resistor to the servo amplifier main body is cut off by the partition panel and suppressed, components inside the servo amplifier are protected from heat.

7 Claims, 3 Drawing Sheets

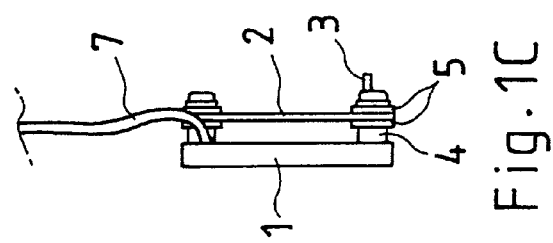
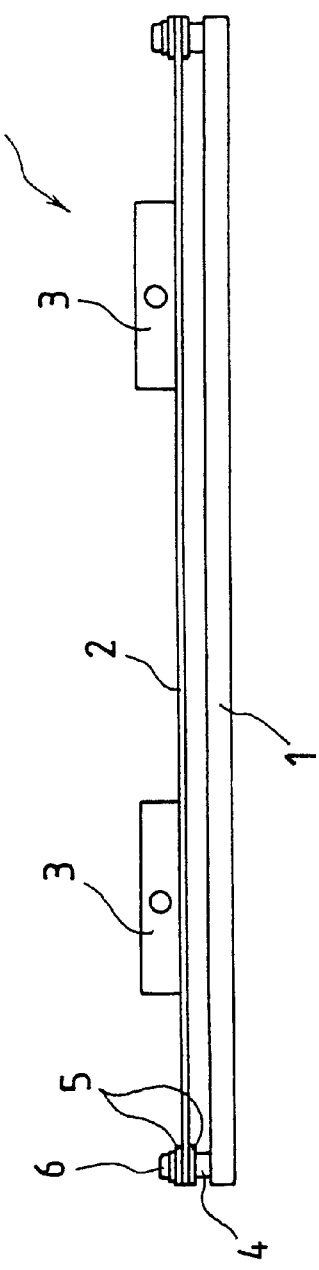
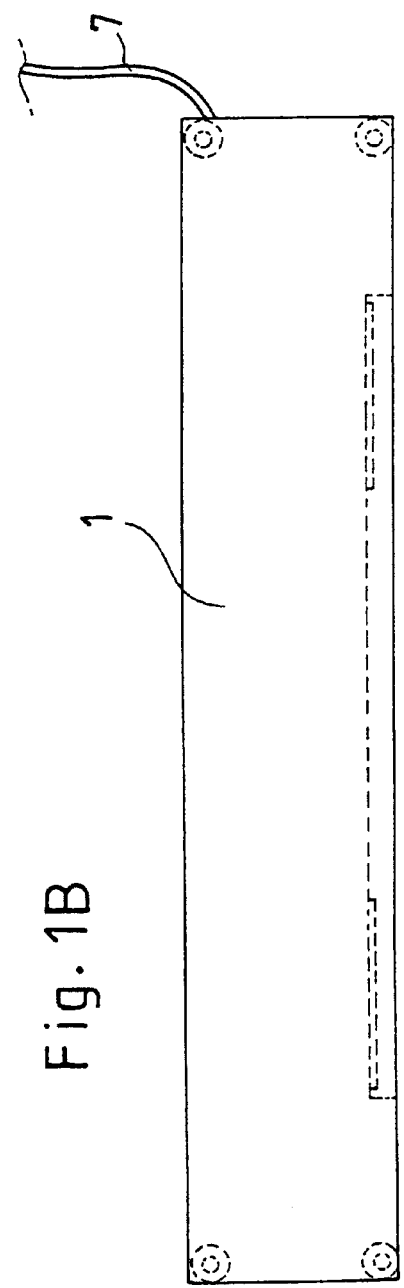

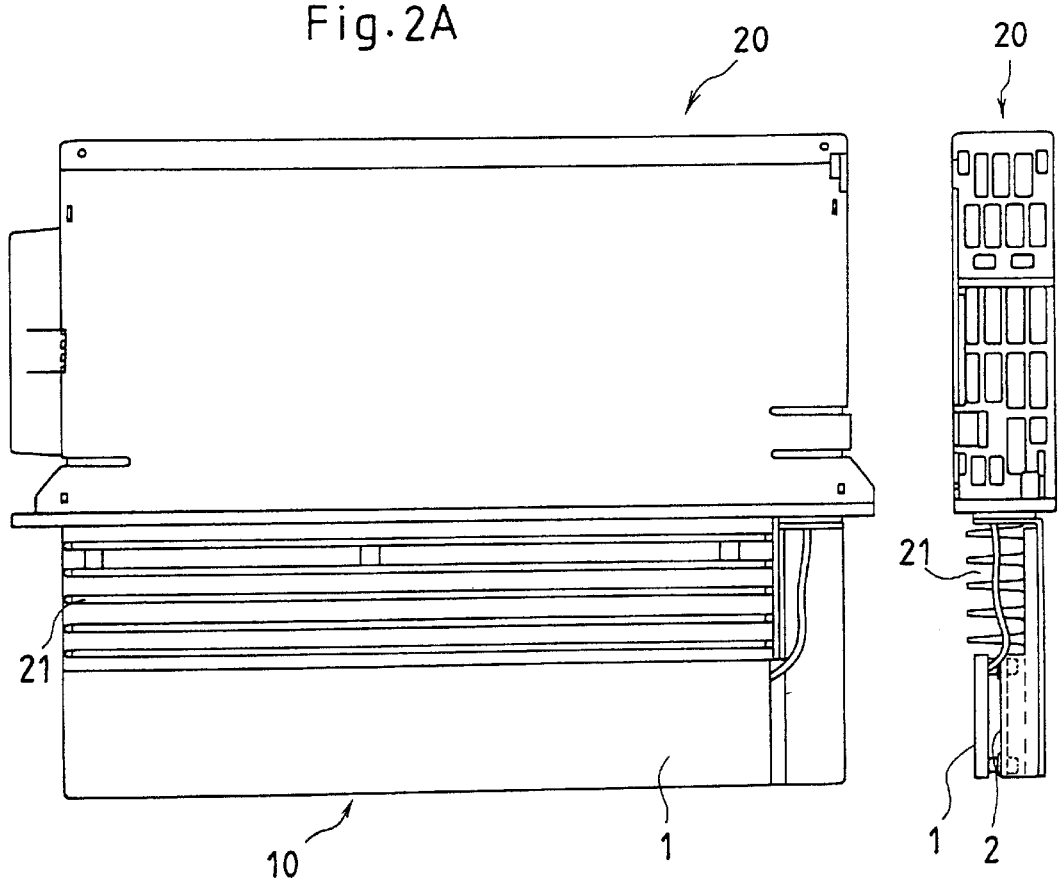

RESISTOR FOR A SERVO AMPLIFIER AND SERVO AMPLIFIER PROVIDED THEREOF

BACKGROUND OF THE INVENTION

1. Field of the Invention

The present invention relates to a resistor utilized in a servo amplifier used in a controller of an industrial equipment such as a machine tool, robot, an injection molding apparatus, a wire electric discharge device and an electric motor presses. The present invention is further related to a servo amplifier provided with this resistor.

2. Description of the Related Art

Servo amplifiers are provided with resistors which generate large amounts of heat such as regenerative resistors which function to consume regenerative current. When installing a resistor which generates large amount of heat in a servo amplifier, the resistor is mounted at location separated from the internal components of the amplifier as well as at the rear of the amplifier in order to eliminate the effects of heat on the internal components of the amplifier.

FIG. 3 shows an example of a conventional servo amplifier provided with a resistor that generates a large amount of heat. A semiconductor module, such as an inverter, and various circuit components 101 are arranged on the surface of a casing 104 of the servo amplifier. Heat sink 102 is disposed on the rear surface of the casing 104. This heat sink functions to release heat generated from the semiconductor module. Further, resistor 103 that generates large amounts of heat is mounted on the rear surface of the casing 104 separated from the heat sink 102 as well as from the various circuit components 101.

If a resistor is separated and mounted away from the internal components of the amplifier and if a resistor is separated and installed away from the internal components of the amplifier on the rear surface of the amplifier, the external shape of the amplifier will grow larger making it impossible to respond to demands for smaller sized servo amplifiers. Moreover, if heat generation passes through the casing of the amplifier and transfers to the inside of the amplifier, the temperature of the components inside the amplifier will rise and as a result lead to lower component lifecycles.

OBJECTS AND SUMMARY OF THE INVENTION

An object of the present invention is to provide a resistor with a construction that makes it difficult for heat to transfer to a servo amplifier and a servo amplifier provided with that resistor.

The resistor for a servo amplifier of the present invention has an assembling construction for mounting a resistor main body to a servo amplifier through an adiabatic layer. The transmission of heat from the resistor main body to the servo amplifier is suppressed by this layer.

In more detail, the transmission of heat from the resistor main body to the partition panel was prevented by providing a resistor main body and a partition panel which has an assembling construction for being mounted on a servo amplifier, linking the resistor main body and the partition panel at intervals using a member comprising a leg portion, and then either providing an adiabatic spacer in this linked portion or composing the leg portion with an adiabatic member. Another way is to compose the partition panel by a material with poor thermal conductivity.

The resistor is assembled in the servo amplifier main body to construct a servo amplifier.

A resistor for a servo amplifier according to the present invention can be mounted at any location on the servo amplifier because an adiabatic layer is provided at the mounting portion of the resistor main body and the servo amplifier to cutoff radiant heat and conductive heat from the resistor main body. Further, since there are no restrictions on the mounting position of the resistor, the size of the servo amplifier can be reduced by installing the resistor on the servo amplifier main body.

BRIEF DESCRIPTION OF THE DRAWINGS

The foregoing and other objects and features of the present invention will become apparent from the following description of preferred embodiments of the present invention with reference to the accompanying drawings, in which;

FIG. 1A is a front view of a non-thermal conductive resistor for a servo amplifier according to an embodiment of the present invention;

FIG. 1B is a side view of the resistor of FIG. 1A;

FIG. 1C is a bottom view of the resistor of FIG. 1A;

FIG. 2A is a side view showing an example wherein the resistor of FIG. 1A is mounted to a servo amplifier;

FIG. 2B is a bottom view of the example of FIG. 2A;

DESCRIPTION OF THE PREFERRED EMBODIMENTS

Figure 3:
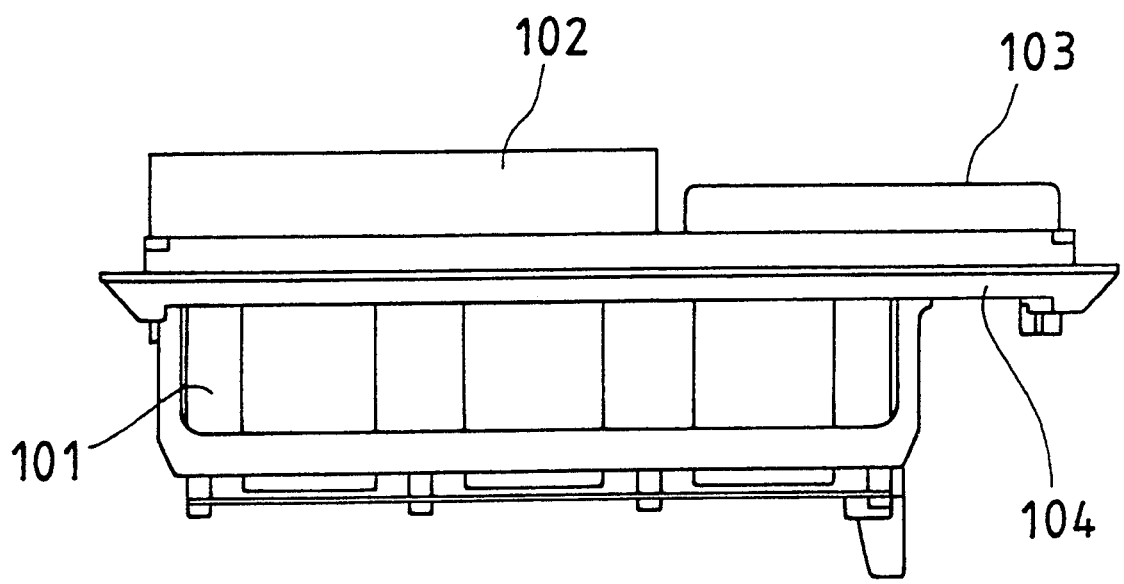
FIG. 3 shows an example of a conventional servo amplifier provided with a resistor that generates a large amount of heat.

FIGS. 1A–1C are used to describe an embodiment of the resistors for a servo amplifier according to the present invention.

The resistor 10 for a servo amplifier has a resistor main body 1 that generates a large amount of heat having leg portions 4 at the four corners and a partition panel 2 having a size larger than or equal to the resistor main body 1. The resistor main body 1 is a resistor main body for regenerative discharge which consumes regenerative energy produced during deceleration of the motor as heat. In other words, the partition panel 2 has an width equal to or more than the surface of the resistor main body 1 such that the resistor is covered.

Further, mounting portions 3 are provided on one surface of the partition panel 2 for the purpose of mounting the resistor 10 to a servo amplifier (not shown in the figure). This partition panel 2 is installed on the above-mentioned four leg portions 4 through an adiabatic spacer 5. Namely, the partition panel 2 is put between each pair of adiabatic spacers 5 at the locations of each leg portion 4 and is secured to the resistor main body 1 by screws 6. Further, reference numeral 7 denotes a lead wire.

The partition panel 2 is mounted to the resistor main body 1 by means of the leg portions 4 and is separated from the resistor main body 1. Therefore, a gap is provided between the partition panel 2 and the resistor main body 1. This gap functions as an adiabatic layer. Because of this, heat generated from the resistor main body 1 is cut off by this adiabatic layer and does not transmit to the partition panel 2.

Even further, because the leg portions 4 and the partition panel 2 are separated by the adiabatic spacer 5, heat from the leg portions 4 is not transmitted to the partition panel 2 either. In addition, heat due to radiation from resistor main body 1 is stopped by the partition panel 2 thereby suppressing the transfer of heat to a servo amplifier installed on the mounting portions 3 provided on one surface (surface on the side of resistor main body 1) of the partition panel 2.

As described above, in the embodiment shown in FIGS. 1A–1C the leg portion 4 protrudes from the resistor main body 1 and the partition panel 2 is connected to the resistor main body 1 using the leg portion 4. In place of this, however, the leg portions 4 protrudes from the partition panel 2 and the resistor main body 1 can be connected to the partition panel 2 using the leg portion 4. Even further, screws and rivet caulking/adhesion can be used for the connection of the resistor main body 1 to the partition panel 2 using the leg portions.

Moreover, in this embodiment, the adiabatic spacers 5 are disposed on both sides above and below the partition panel 2 engaged to the leg portions 4. Therefore, a total of eight spacers 5 are used. By using eight spacers 5 for the four leg portions 4, the transmission of heat can be considerably prevented. However, in a range wherein the effects of the transmission of heat are not severely received, the numbers of spacers 5 can be reduced by a few.

The partition panel 2 can be composed using material with poor thermal conductivity. If this type of material is used, it will become unnecessary to provide a spacer on leg portion 4 to provide adiabatic properties.

Even further, in this embodiment, the gap between the partition panel 2 and the resistor main body 1 forms an adiabatic layer. However, in place of using the partition panel to form an adiabatic layer, an adiabatic material may be secured to one surface of the resistor main body 1 and then mounting portions 3 may be disposed on the surface of the adiabatic material which is opposite the side of the resistor main body 1. If constructed in this manner, the adiabatic material will form an adiabatic layer and the transmission of heat from the resistor main body to the servo amplifier can be suppressed.

FIGS. 2A and 2B show an example wherein the resistor 10 shown in FIGS. 1A–1C is mounted to the servo amplifier main body 20. In this example, the resistor 10 is closely attached to the side of the servo amplifier main body 20 such that the resistor 10 and the heat sink 21 of the servo amplifier main body 20 overlap each other.

The resistor 10 is mounted to the casing of the servo amplifier through the mounting portion 3 disposed on the partition panel 2 separated from the resistor main body 1. Because of this, heat from the resistor main body 1 is cut off by partition panel 2 and the transmission of heat to the servo amplifier main body 20 is suppressed. Thus, the electronic components of the servo amplifier main body 20 are protected from heat generating from the resistor main body 1.

What is claimed is:

1. A resistor assembly for a servo amplifier driving a motor, comprising:

a resistor main body for discharge of regenerative energy produced during deceleration of the motor as heat; and an assembling construction mounting the resistor main body to the servo amplifier, including a partition panel at a distance from the resistor main body forming an adiabatic layer between the resistor main body and the partition panel, with the servo amplifier attached to the assembling construction on a side of the partition panel opposite from the adiabatic layer.

2. A resistor assembly for a servo amplifier according to claim 1, wherein the partition panel is fixed to the resistor main body by a leg portion protruding from one of the resistor main body and the partition panel.

3. A resistor assembly for a servo amplifier according to claim 2, further comprising an adiabatic spacer interposed between the leg portion and the partition panel.

4. A resistor assembly for a servo amplifier according to claim 1, wherein the partition panel is formed of a material with low thermal conductivity.

5. A servo amplifier assembly for driving a motor, comprising:

a servo amplifier; and a regenerative resistor to convert regenerative energy produced during deceleration of the motor to heat, including a resistor main body and an assembling construction mounting the resistor main body to the servo amplifier, the resistor main body and the servo amplifier being arranged opposite to each other with an adiabatic layer of an adiabatic material interposed therebetween.

6. A servo amplifier assembly according to claim 5, wherein said servo amplifier includes a switching element for driving the motor, wherein said servo amplifier assembly further comprises a heat sink for cooling the switching element, and wherein said regenerative resistor is attached intimately to a side face of the servo amplifier overlapping the heat sink.

7. A servo amplifier assembly according to claim 6, wherein said assembling construction includes a partition panel at a distance from the resistor main body forming an adiabatic layer between the resistor main body and the partition panel, the partition panel being attached to the resistor main body by a leg portion protruding from one of the resistor main body and the partition panel, and an adiabatic spacer interposed between the resistor main body and the partition panel.

* * * * *